US010321576B2

(12) United States Patent
Ahn

(10) Patent No.: US 10,321,576 B2
(45) Date of Patent: Jun. 11, 2019

(54) CURVED DISPLAY DEVICE

(71) Applicant: Samsung Display Co., Ltd., Yongin-si, Gyeonggi-do (KR)

(72) Inventor: Hyeong-Cheol Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/596,949

(22) Filed: May 16, 2017

(65) Prior Publication Data

US 2017/0249887 A1    Aug. 31, 2017

Related U.S. Application Data

(63) Continuation of application No. 14/276,866, filed on May 13, 2014, now Pat. No. 9,674,961.

(30) Foreign Application Priority Data

Sep. 30, 2013 (KR) ........................ 10-2013-0116574

(51) Int. Cl.
| | |
|---|---|
| H05K 1/14 | (2006.01) |
| H05K 1/18 | (2006.01) |
| G02F 1/1333 | (2006.01) |
| G02F 1/1345 | (2006.01) |

(52) U.S. Cl.
CPC ......... *H05K 1/189* (2013.01); *G02F 1/13452* (2013.01); *G02F 1/133305* (2013.01); *G02F 2201/56* (2013.01); *H05K 1/147* (2013.01); *H05K 2201/10128* (2013.01); *H05K 2201/2036* (2013.01)

(58) Field of Classification Search
CPC .... H05K 1/189; H05K 1/147; G02F 1/13452; G02F 1/133305; G02F 2201/56
See application file for complete search history.

(56) References Cited

U.S. PATENT DOCUMENTS

| | | |
|---|---|---|
| 5,193,021 A | 3/1993 | Kim |
| 5,838,412 A | 11/1998 | Ueda et al. |
| 6,177,971 B1 | 1/2001 | Jung et al. |

(Continued)

FOREIGN PATENT DOCUMENTS

| | | | |
|---|---|---|---|
| DE | 202013100638 | * 3/2013 | ........... G02F 1/1333 |
| JP | 2007-079133 | 3/2007 | |

(Continued)

OTHER PUBLICATIONS

Korean Patent Abstracts Publication No. KR 10-2005-0060349 A, dated Jun. 22, 2005, for KR 10-1051013, 2 pages.

*Primary Examiner* — Nathan Milakovich
(74) *Attorney, Agent, or Firm* — Lewis Roca Rothgerber Christie LLP

(57) ABSTRACT

A curved display device includes a display panel including a terminal part configured to receive a driving signal, a driving circuit film including a base film and a driving chip on the base film, and a spacer disposed between the base film and the display panel. The driving chip is configured to generate the driving signal, the driving circuit film is configured to apply the driving signal to the display panel, and the driving circuit film is coupled to the terminal part and bent toward a lower surface of the display panel. The display panel and a surface of the spacer are curved along a first direction.

22 Claims, 9 Drawing Sheets

(56) References Cited

U.S. PATENT DOCUMENTS

| | | |
|---|---|---|
| 6,657,606 B2 | 12/2003 | Kang et al. |
| 6,806,936 B2 | 10/2004 | Nakaminami et al. |
| 7,236,223 B2 * | 6/2007 | Matsuyama ........ G02F 1/13394 349/123 |
| 7,576,430 B2 | 8/2009 | Chang et al. |
| 7,633,761 B2 | 12/2009 | Kim |
| 7,772,770 B2 | 8/2010 | Kim et al. |
| 7,821,612 B2 | 10/2010 | Koo |
| 7,920,223 B2 | 4/2011 | Nishizawa et al. |
| 8,446,557 B2 | 5/2013 | Oohira |
| 8,477,271 B2 | 7/2013 | Enomoto |
| 8,508,706 B2 | 8/2013 | Minami |
| 8,858,007 B2 | 10/2014 | Kim et al. |
| 9,030,826 B2 | 5/2015 | Kim et al. |
| 9,167,697 B2 | 10/2015 | Kim et al. |
| 9,357,638 B2 | 5/2016 | Lee et al. |
| 9,588,379 B2 * | 3/2017 | Park .................... G02F 1/13394 |
| 9,674,961 B2 * | 6/2017 | Ahn ........................ H05K 1/189 |
| 9,826,627 B2 * | 11/2017 | Chen ....................... H05K 1/028 |
| 9,883,593 B2 * | 1/2018 | Cho ........................ H05K 1/189 |
| 2005/0233613 A1 | 10/2005 | Naitoh et al. |
| 2007/0139605 A1 * | 6/2007 | Matsuda ........... G02F 1/133308 349/158 |
| 2007/0146616 A1 * | 6/2007 | Nouchi ................. G02F 1/1333 349/155 |
| 2009/0039495 A1 | 2/2009 | Yamashita et al. |
| 2010/0182274 A1 | 7/2010 | Kang et al. |
| 2010/0220072 A1 | 9/2010 | Chien et al. |
| 2010/0302478 A1 | 12/2010 | Nakagawa et al. |
| 2011/0193478 A1 | 8/2011 | Kim |
| 2011/0204497 A1 | 8/2011 | Matsuda et al. |
| 2013/0100392 A1 | 4/2013 | Fukushima |
| 2013/0140965 A1 * | 6/2013 | Franklin ................ G06F 1/1626 312/223.1 |
| 2013/0293816 A1 | 11/2013 | Jung et al. |
| 2013/0321740 A1 * | 12/2013 | An ........................ H05K 5/0217 349/58 |
| 2014/0092350 A1 * | 4/2014 | Byeon .................... G02F 1/1339 349/106 |
| 2014/0217382 A1 | 8/2014 | Kwon et al. |
| 2014/0307396 A1 | 10/2014 | Lee |
| 2015/0036300 A1 | 2/2015 | Park et al. |
| 2015/0070840 A1 | 3/2015 | Rappoport et al. |
| 2015/0092362 A1 | 4/2015 | Ahn |
| 2015/0173171 A1 | 6/2015 | Kim et al. |
| 2015/0264805 A1 | 9/2015 | Chen et al. |
| 2015/0277131 A1 * | 10/2015 | Park .................... G02B 27/2221 349/58 |
| 2016/0044790 A1 | 2/2016 | Cho et al. |
| 2016/0219695 A1 | 7/2016 | Choi |
| 2016/0219723 A1 | 7/2016 | Jung et al. |

FOREIGN PATENT DOCUMENTS

| | | |
|---|---|---|
| JP | 2009-192796 | 8/2009 |
| JP | 5081965 | 11/2012 |
| KR | 10-2010-0048526 | 5/2010 |
| KR | 10-1051013 | 7/2011 |
| KR | 10-2013-0053280 | 5/2013 |

* cited by examiner

CURVED DISPLAY DEVICE

CROSS-REFERENCE TO RELATED APPLICATION

This application is a continuation of U.S. patent application Ser. No. 14/276,866, filed May 13, 2014, which claims priority to and the benefit of Korean Patent Application No. 10-2013-0116574, filed on Sep. 30, 2013, the entire contents of both of which are incorporated herein by reference.

BACKGROUND

1. Field

The present disclosure relates to a flexible display device.

2. Description of the Related Art

A flexible display device has a flexible property to provide excellent transportability. In addition, because the flexible display device has a curved shape, it provides a three-dimensional effect and/or immersiveness to a user.

The flexible display device includes a display panel and a driving unit coupled to the display panel to drive the display panel. The display panel includes a flexible base substrate, such as a polyimide film, and a plurality of pixels disposed on the base substrate. The driving unit includes a driving circuit film coupled to the display panel.

Meanwhile, the display panel and the driving unit need to be reliably coupled so that no defect occurs during the operation (e.g., the functioning) of the flexible display device, even when the flexible display device is bent by the user.

SUMMARY

Aspects of embodiments of the present disclosure are directed toward a flexible display device having a flexible property to provide a curved display area. Aspects of embodiments of the present disclosure are also directed toward a flexible display device having an improved reliability.

According to an embodiments of the present disclosure, a flexible display device includes a flexible display panel, a driving circuit film, and a spacer. The flexible display panel includes a terminal part configured to receive a driving signal. The driving circuit film includes a base film and a driving chip on the base film, the driving chip being configured to generate the driving signal. The driving circuit film is coupled to the terminal part, configured to apply the driving signal to the display panel, and bent toward a lower surface of the display panel. The spacer is on the driving circuit film and configured to maintain a gap between the driving chip and the lower surface of the display panel.

A display area of the display panel and the lower surface of the display panel may have a curved shape.

The spacer may have a supporting surface contacting the lower surface of the display panel, and the supporting surface may have a curved shape corresponding to the curved shape of the lower surface.

The spacer may be between the lower surface of the display panel and the driving chip.

The spacer may extend past both sides of the driving chip.

The spacer may be between the lower surface of the display panel and the base film.

The spacer may include two spacers, and each spacer may be spaced from and adjacent to opposite ends of the driving chip.

The spacer may have a closed-loop shape to surround a perimeter of the driving chip.

The spacer may surround a portion of a perimeter of the driving chip.

The display panel may be curved along a first direction, and the terminal part may extend along the first direction.

A shorter side of the display panel may be curved along the first direction.

A longer side of the display panel may be curved along the first direction.

The driving chip may extend along the first direction.

The flexible display device may further include a driving circuit board adjacent to the lower surface of the display panel and electrically coupled to the driving circuit film, and the driving circuit film may be bent from the terminal part toward the driving circuit board.

The flexible display device may further include a window substrate including a light transmissive portion and covering the display panel, and a touch screen between the window substrate and the display panel and configured to detect a touch position generated on the window substrate, wherein the window substrate and the touch screen may be curved together with the display panel.

The display panel may include a display area having a curved shape, and the display area may have a concave shape.

The display panel may include a display area having a curved shape, and the display area may have a convex shape.

The display panel may be an organic electroluminescent display panel.

The spacer may have a closed-loop shape and may overlap a portion of the driving chip.

The spacer may extend along at least a portion of a side of the driving chip and may extend past the side and an opposite side of the driving chip.

As described above, the spacer is between the curved display panel and the driving circuit film. Therefore, the driving chip of the driving circuit film makes contact with the display panel. Although pressure may be applied to the driving chip, the pressure is prevented from being concentrated at a portion (e.g., a single portion or a point) of the driving chip, thereby preventing the driving chip from being damaged.

In addition, because the gap between the display panel and the driving chip is maintained by the spacer, the driving chip may not be substantially bent when the display panel is bent.

BRIEF DESCRIPTION OF THE DRAWINGS

The above and other aspects and features of the present disclosure will become more readily apparent by reference to the following detailed description when considered in conjunction with the accompanying drawings, wherein.

DETAILED DESCRIPTION

Figure 1:
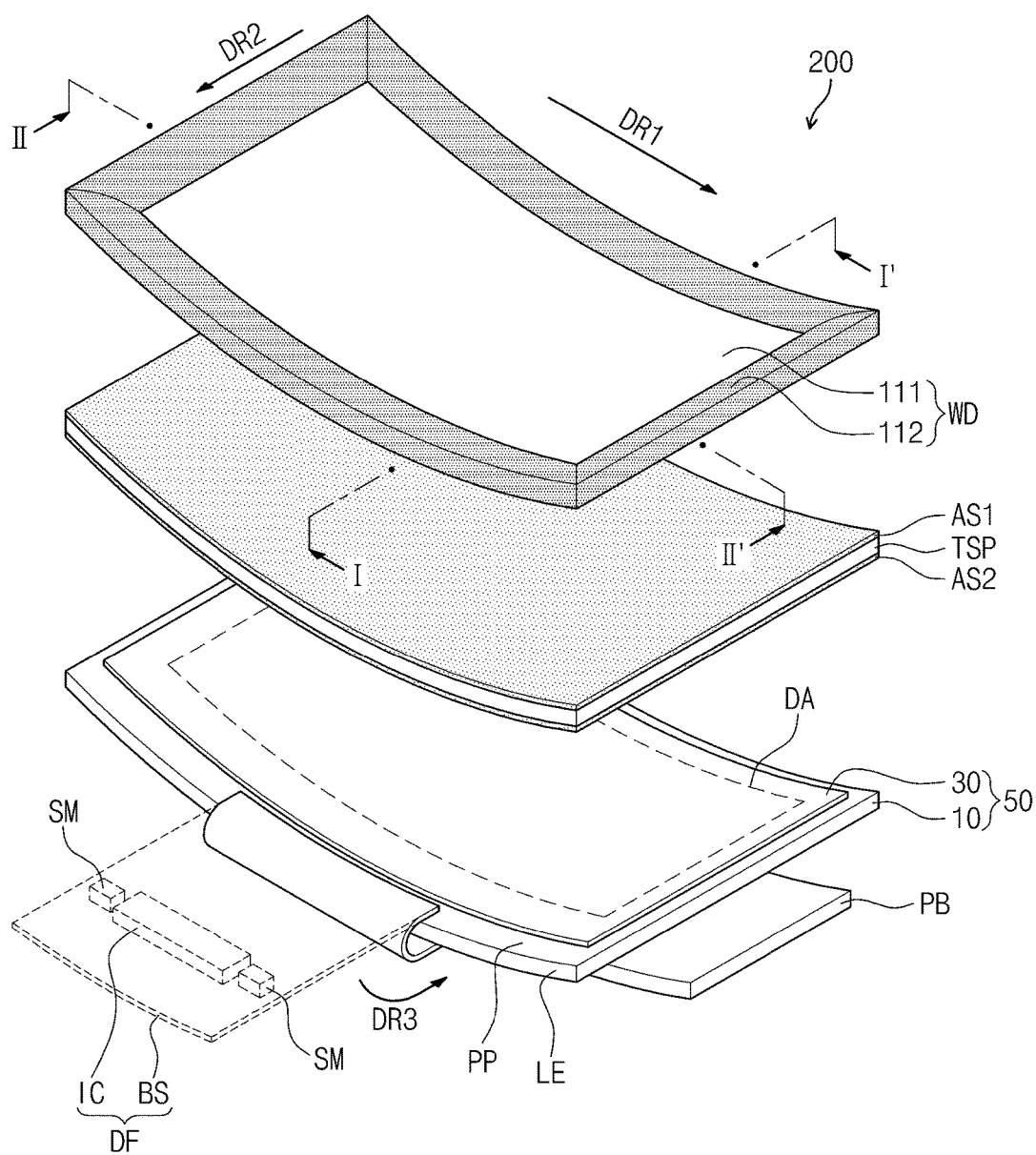
FIG. 1 is an exploded perspective view showing a flexible display device according to an example embodiment of the present disclosure.

It will be understood that when an element or layer is referred to as being "on", "connected to", or "coupled to" another element or layer, it can be directly on, connected, or coupled to the other element or layer or one or more intervening elements or layers may also be present. When an element is referred to as being "directly on," "directly connected to", or "directly coupled to" another element or layer, there are no intervening elements or layers present. Like reference designators refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein are to be interpreted accordingly.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2A:
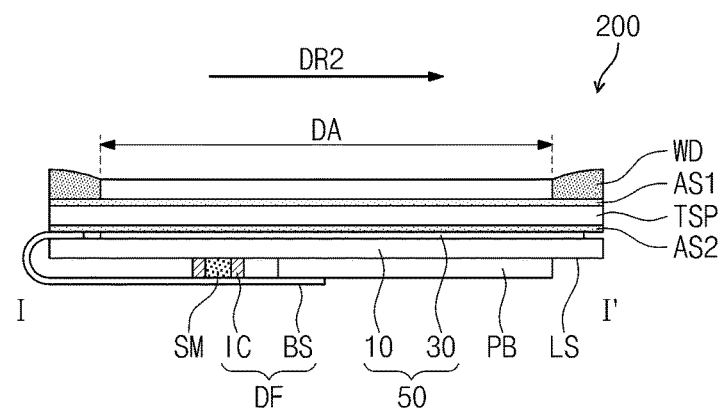
FIG. 2A is a cross-sectional view taken along a line I-I' of FIG. 1.
Figure 2B:
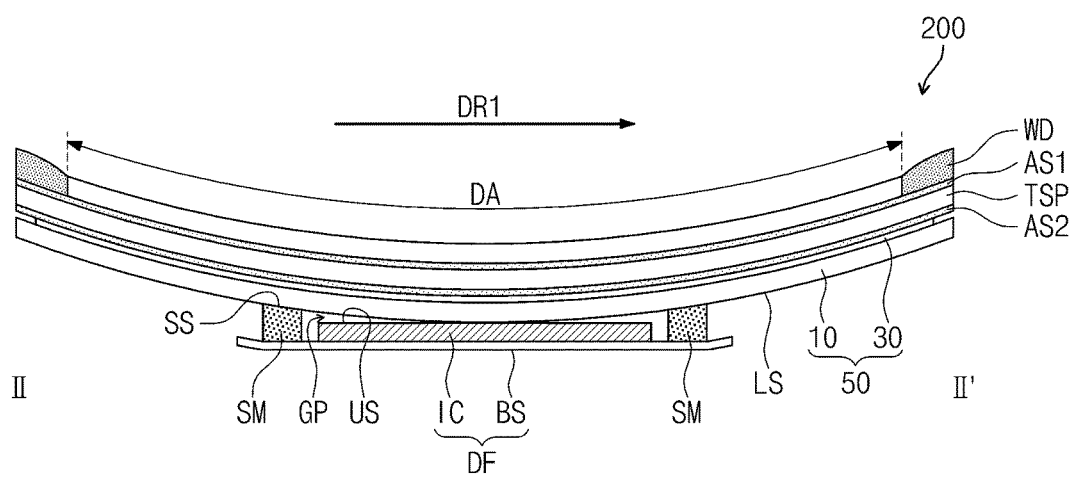
FIG. 2B is a cross-sectional view taken along a line II-II' of FIG. 1.

FIG. 1 is an exploded perspective view showing a flexible display device according to an example embodiment of the present disclosure, FIG. 2A is a cross-sectional view taken along a line I-I' of FIG. 1, and FIG. 2B is a cross-sectional view taken along a line II-II' of FIG. 1.

Referring to FIGS. 1, 2A, and 2B, a flexible display device 200 includes a display panel 50, a driving circuit film DF, a driving circuit board PB, a first adhesive member AS1, a touch screen TSP, a second adhesive member AS2, a window substrate WD, and a spacer SM. The flexible display device 200 may further include other elements, such as a housing to accommodate the above-described elements.

The display panel 50 displays an image (e.g., is configured to display an image) utilizing (e.g., using) light exiting through (e.g., emitted by) a display area DA. The display panel 50 has a flexible property and includes a display substrate 10 and a sealing part 30. The display substrate 10 includes a flexible base substrate, such as a plastic substrate, and a plurality of pixels disposed on the base substrate. The sealing part 30 includes a plurality of inorganic layers and a plurality of organic layers that are alternately stacked with the inorganic layers to have the flexible property, and the sealing part 30 covers the display substrate 10 to protect and to prevent moisture and air from entering into the display substrate 10.

In the present example embodiment, the display panel 50 may be an organic electroluminescent display panel. In this case, each of the pixels includes an anode, a cathode, and an organic light emitting layer disposed between the anode and the cathode to emit light, but the display panel 50 should not be limited to the organic electroluminescent display panel. For instance, the display panel 50 may be a liquid crystal display panel having a flexible property. In the case that the display panel 50 is the liquid crystal display panel, the display panel 50 may include an opposite substrate on which a common electrode is formed and a liquid crystal layer disposed between the opposite substrate and the display substrate 10, and the opposite substrate may replace or take the place of the sealing part 30. In addition, the display substrate 10 may include a plurality of pixel electrodes that forms an electric field in cooperation with the common electrode, and the flexible display device 200 may further include a backlight unit to provide light to the display panel 50.

The display panel 50 may have a curved shape, curved along a first direction DR1, due to its flexible property. Thus, the display area DA displaying the image of the display panel 50 has a curved surface shape (e.g., a curved shape) that is curved along the first direction DR1. As a result, the flexible display device 200 displays the image having an improved three-dimensional effect and immersiveness through the display area DA with the curved surface shape.

The display panel 50 may include a terminal part PP, and a driving signal configured to drive the display panel 50 is applied to the display panel 50 through the terminal part PP. When a side of the display panel 50, which is curved along the first direction DR1, is defined as a long side LE (e.g., a longer side of the display panel 50), the terminal part PP extends along the long side LE of the display panel 50 and is disposed at one side of the display panel 50.

The terminal part PP includes a plurality of signal lines and a plurality of bonding pads. The signal lines are electrically coupled to (e.g., electrically connected to) the pixels to transmit the driving signal to the pixels, and the bonding pads are electrically coupled to (e.g., electrically connected to) the signal lines to be electrically coupled to (e.g., electrically connected to) the driving circuit film DF.

The driving circuit film DF includes a flexible base film BS, a plurality of conductive lines, and a driving chip IC. The plurality of conductive lines and the driving chip IC are disposed on the base film BS. The driving circuit film DF is coupled to the display panel 50 and the driving circuit board PB, and thus the display panel 50 is electrically coupled to (e.g., electrically connected to) the driving circuit board PB through the driving circuit film DF.

In more detail, one end of the driving circuit film DF is electrically coupled to (e.g., electrically connected to) the terminal part PP, and the other end of the driving circuit film DF is electrically coupled to (e.g., electrically connected to) the driving circuit board PB. In manufacturing, because the driving circuit board PB is to be disposed adjacent to a lower surface LS of the display panel 50 (see FIG. 2), the driving circuit film DF is bent or curved along a third direction DR3 (e.g., a loop direction) from the terminal part PP toward the driving circuit board PB disposed under the terminal part PP as shown in FIG. 1. Therefore, the terminal part PP is electrically coupled to (e.g., electrically connected to) the driving circuit board PB by the driving circuit film DF with ease.

In the present example embodiment, the driving chip IC may be mounted on the base film BS in a flexible chip on film (COF) package, and the driving chip IC generates the driving signal. The driving chip IC may extend along the first direction DR1, in which the terminal part PP extends, such that output terminals of the driving chip IC may be easily coupled to (e.g., connected to) input terminals disposed on the terminal part PP.

The driving circuit board PB is disposed to face the window substrate WD, and the display panel 50 is disposed between the driving circuit board PB and the window substrate WD. The driving circuit board PB includes a timing controller to control the image displayed on the display panel 50. In addition, the driving circuit board PB may further include a plurality of electrical components, which perform various functions of the flexible display device 200, such as a camera module, a speaker module, etc.

The window substrate WD includes a light transmissive part 111 (e.g., a light transmissive portion) to transmit light therethrough and a light blocking part 112 (e.g., a light blocking portion) to block light (e.g., to prevent light from transmitting therethrough). The light transmissive part 111 is disposed to correspond to the display area DA, and the light blocking part 112 is disposed to correspond to an area surrounding the display area DA. Thus, light exiting from (e.g., light emitted by) the display panel 50 may be perceived by a user after passing through the light transmissive part 111. In the present example embodiment, the light transmissive part 111 may have a flat shape, and the light blocking part 112 may have a thickness thicker than that of the light transmissive part 111 and may have a convex shape.

The touch screen TSP is coupled to the window substrate WD to detect a touch position on the window substrate WD (e.g., the touch screen TSP is configured to detect a touch position on the window substrate WD), at which a touch event occurs. The touch screen TSP may be an electrostatic capacitive touch screen, however, it should not be limited thereto. For instance, the touch screen TSP may be a resistive film touch screen, an ultrasonic touch screen, or an infrared touch screen.

The first adhesive member AS1 is disposed between the window substrate WD and the touch screen TSP, and the second adhesive member AS2 is disposed between the touch screen TSP and the display panel 50. The first adhesive member AS1 bonds the touch screen TSP to the window substrate WD, and the second adhesive member AS2 bonds the touch screen TSP to the display panel 50. In the present example embodiment, each of the first and second adhesive members AS1 and AS2 may be an adhesive film having a light transmissive property. For instance, each of the first and second members AS1 and AS2 may be an optically clear adhesive (OCA).

The window substrate WD, the touch screen TSP, the first adhesive member AS1, and the second adhesive member AS2 are curved along the first direction DR1 to correspond to the curved shape of the display panel 50.

The spacer SM is disposed on the driving circuit film DF to maintain a gap GP between the driving chip IC and the lower surface LS of the display panel 50. The spacer SM is disposed on the base film BS and is between the base film BS and the lower surface LS. The spacer SM may include two spacers SM that are each spaced from (e.g., spaced apart from) the driving chip IC to be disposed adjacent to both ends of the driving chip IC.

As shown in FIG. 2B, because the display panel 50 is curved along the first direction DR1, not only does the display area DA have the curved shape, but the lower surface LS also has the curved surface shape, curved along the first direction DR1. Thus, a supporting surface SS of the spacer SM, which makes contact with the lower surface LS, has a curved surface shape corresponding to the curved surface shape of the lower surface LS. In addition, a height of the lower surface LS above the base film BS may vary with respect to the base film BS, and thus, the spacer SM has a variable thickness corresponding to the height of the lower surface LS.

In the present example embodiment, because the driving chip IC includes a semiconductor substrate, such as a wafer, the driving chip IC may not be flexible. In the case that the driving chip IC is not flexible, an upper surface US of the driving chip IC facing the lower substrate LS has a substantially flat shape. Thus, when the driving chip IC makes contact with the lower substrate LS, only a portion of the upper surface US makes contact with the lower substrate LS (that is, less than the entire upper surface US makes contact with the lower substrate LS).

As described above, in the case that the upper surface US makes partial contact with the lower surface LS and a pressure is applied to the driving chip IC from an external source, the spacer SM alleviates the pressure to prevent or protect the pressure from being concentrated at an area where the upper surface US makes contact with the lower surface LS (e.g., the spacer SM extends or lengthens to prevent pressure from being concentrated at a portion of the driving chip IC).

Different from the above-mentioned embodiments of the present disclosure, in a comparative example in which the spacer SM is omitted from the flexible display device 200 and the pressure is applied to the driving chip IC, the driving chip IC may be damaged or bent along the curved surface shape of the lower surface LS due to the pressure. According to the present example embodiment, however, the spacer SM alleviates the pressure and maintains the gap GP between the driving chip IC and the lower surface LS, thereby preventing the driving circuit IC from being damaged or bent.

The spacer SM may include an insulating material, such as polymer resin. For instance, the spacer SM may include an elastic material, such as rubber or silicon, to alleviate the pressure applied to the driving circuit film DF. According to another example embodiment, the spacer SM may include an adhesive material to bond to the base film BS and the lower surface LS.

Figure 3A:
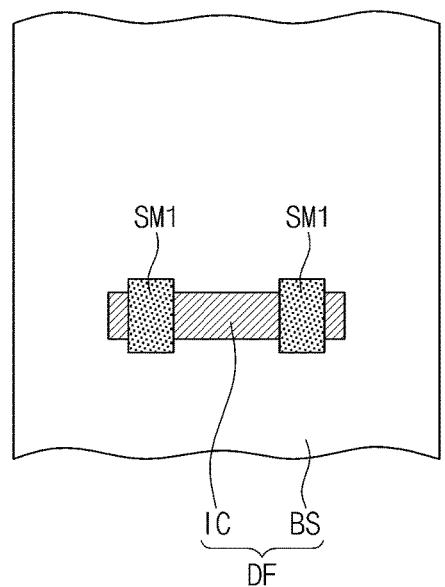
FIG. 3A is a plan view showing a driving circuit film and a spacer included in a flexible display device according to another example embodiment of the present disclosure.
Figure 3B:
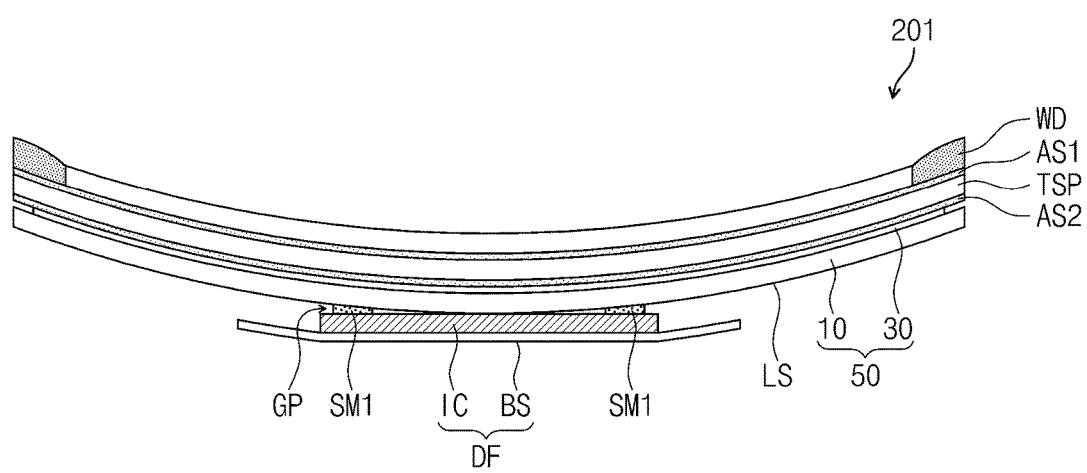
FIG. 3B is a cross-sectional view showing the flexible display device including the driving circuit film and the spacer shown in FIG. 3A.

FIG. 3A is a plan view showing a driving circuit film and a spacer included in a flexible display device according to another example embodiment of the present disclosure, and FIG. 3B is a cross-sectional view showing the flexible display device including the driving circuit film and the spacer shown in FIG. 3A. In FIGS. 3A and 3B, the same reference designators denote the same elements as those in FIGS. 1, 2A, and 2B, and thus the detailed descriptions of the same elements may be omitted.

Referring to FIGS. 3A and 3B, a flexible display device 201 includes a display panel 50, a driving circuit film DF, and a spacer SM1. The spacer SM1 is disposed on a driving chip IC and is between a lower surface LS of the display panel 50 and the driving chip IC. The spacer SM1 extends beyond both sides of (e.g., is overlapped with both ends of) the driving chip IC when viewed in a plan view as shown in FIG. 3A.

Because the spacer SM1 makes contact with the lower surface LS, a pressure applied to the driving chip IC is alleviated by the spacer SM1, thereby preventing the driving chip IC from being damaged due to the pressure applied to the driving chip IC (that is, because the spacer SM1 is between the lower surface LS and the driving chip IC, it alleviates pressure applied to the driving chip IC). In addition, the spacer SM1 maintains a gap GP between the driving chip IC and the lower surface LS, and thus the driving chip IC may be prevented from being curved or cracked along the curved surface shape of the lower surface LS.

Figure 4A:
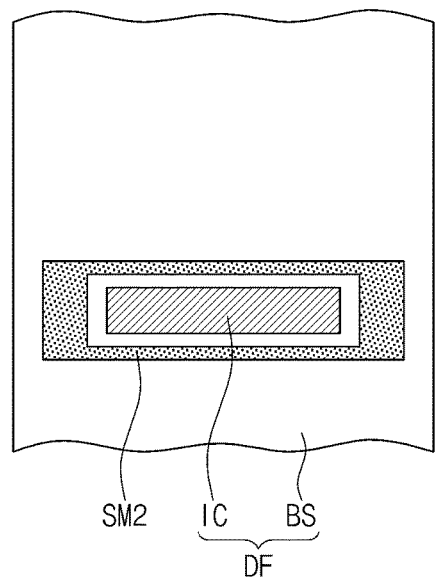
FIG. 4A is a plan view showing a driving circuit film and a spacer included in a flexible display device according to another example embodiment of the present disclosure.
Figure 4B:
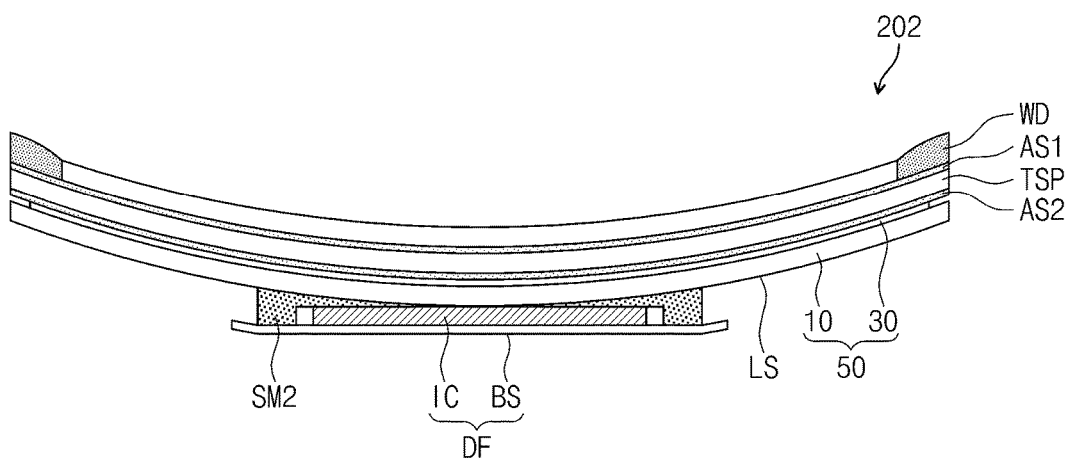
FIG. 4B is a cross-sectional view showing the flexible display device including the driving circuit film and the spacer shown in FIG. 4A.

FIG. 4A is a plan view showing a driving circuit film and a spacer included in a flexible display device according to another example embodiment of the present disclosure, and FIG. 4B is a cross-sectional view showing the flexible display device including the driving circuit film and the spacer shown in FIG. 4A. In FIGS. 4A and 4B, the same reference designators denote the same elements as those shown in the previously described embodiments, and thus the detailed descriptions of the same elements may be omitted.

Referring to FIGS. 4A and 4B, a flexible display device 202 includes a display panel 50, a driving circuit film DF, and a spacer SM2. In the present example embodiment, the spacer SM2 may have a closed-loop shape (e.g., a rectangular shape) surrounding a driving chip IC when viewed in a plan view.

Similar to the embodiments previously described, the spacer SM2 according to the present example embodiment is disposed on the driving circuit film DF to maintain a gap between the driving chip IC and a lower surface LS of the display panel 50. Because the driving chip IC makes partial contact with the lower surface LS, a pressure is prevented or protected from being concentrated at the driving chip IC. As a result, the driving chip IC is prevented or protected from being curved or cracked by the pressure even though the display panel 50 is curved.

Figure 5A:
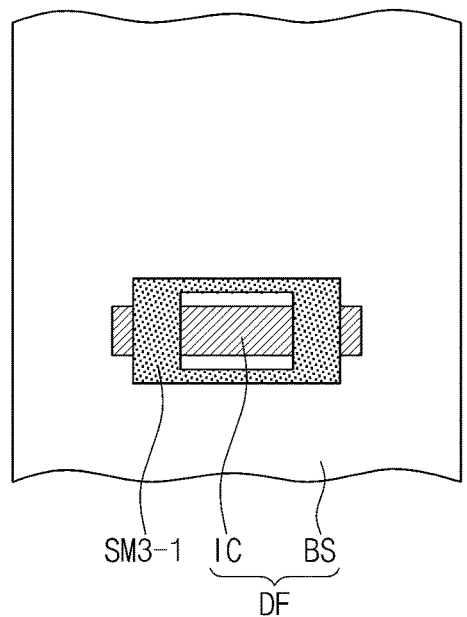
FIGS. 5A, 5B, and 5C are plan views each showing a driving circuit film and a spacer included in a flexible display device according to other example embodiments of the present disclosure.
Figure 5B:
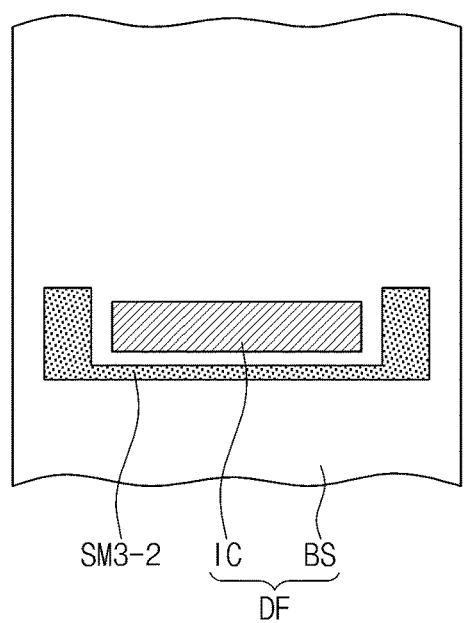
Figure 5C:
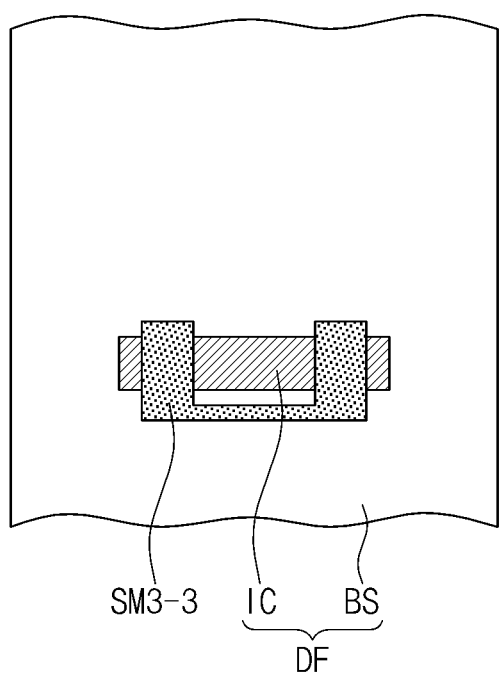

FIGS. 5A, 5B, and 5C are plan views each showing a driving circuit film and a spacer included a flexible display device according to other example embodiments of the present disclosure. In FIGS. 5A, 5B, and 5C, the same reference designators denote the same elements as those shown in the previously described embodiments, and thus the detailed descriptions of the same elements may be omitted.

Referring to FIG. 5A, a spacer SM3-1 is disposed on a driving circuit film DF, has a closed-loop shape (e.g., a rectangular shape) surrounding a portion of a driving chip IC, and is partially overlapped with the driving chip IC when viewed in a plan view.

Referring to FIG. 5B, a spacer SM3-2 is disposed on a driving circuit film DF. In addition, the spacer SM3-2 is spaced from (e.g., spaced apart from and/or does not overlap) and partially surrounds a driving chip IC, and a portion of the spacer SM3-2, which corresponds to one of two longer sides of the driving chip IC, is opened when viewed in a plan view (that is, the spacer SM3-2 substantially surrounds three sides of the driving chip IC).

Referring to FIG. 5C, a spacer SM3-3 is disposed on a driving circuit film DF and is partially overlapped with a driving chip IC when viewed in a plan view. Also, a portion of the spacer SM3-3, which corresponds to one of two longer sides of the driving chip IC, is opened when viewed in a plan view (that is, the spacer SM3-3 extends along three sides of the driving chip IC).

In the present example embodiments shown in FIGS. 5A to 5C, the spacers SM3-1, SM3-2, and SM3-3 maintain a gap between the driving chip IC and a display panel 50. Therefore, a pressure applied to the driving chip IC is alleviated by the spacers SM3-1, SM3-2, and SM3-3, and the gap between the driving chip IC and the display panel 50 is maintained by the spacers SM3-1, SM3-2, and SM3-3. Thus, the driving chip IC may be prevented or protected from being bent due to the curved shape of the display panel 50.

Figure 6A:
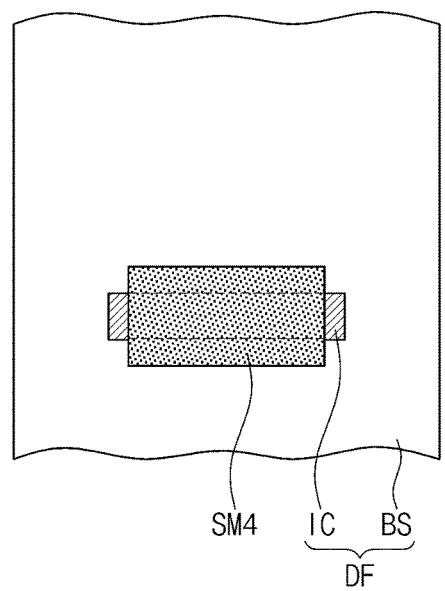
FIG. 6A is a plan view showing a driving circuit film and a spacer included in a flexible display device according to another example embodiment of the present disclosure.
Figure 6B:
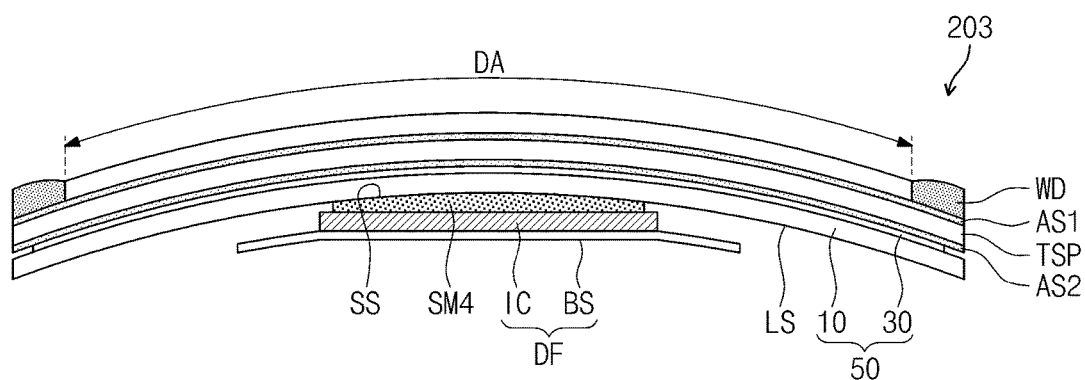
FIG. 6B is a cross-sectional view showing the flexible display device including the driving circuit film and the spacer shown in FIG. 6A.

FIG. 6A is a plan view showing a driving circuit film and a spacer included in a flexible display device according to another example embodiment of the present disclosure, and FIG. 6B is a cross-sectional view showing the flexible display device including the driving circuit film and the spacer shown in FIG. 6A. In FIGS. 6A and 6B, the same reference designators denote the same elements as those shown in the previously described embodiments, and thus the detailed descriptions of the same elements may be omitted.

Referring to FIGS. 6A and 6B, a flexible display device 203 includes a display panel 50, a driving circuit film DF, and a spacer SM4. In the example embodiment described with reference to FIG. 2B, the display area DA (refer to FIG. 2B) has the curved surface shape of which edge portions are more convex than a center portion (e.g., the lower surface of the display panel 50 of the embodiment illustrated in FIG. 2 has a concave curved surface shape corresponding to the display area DA). However, in the present example embodiments shown in FIGS. 6A and 6B, a display area DA of the display panel 50 has a curved surface shape of which a center portion is more convex than edge portions. In this case, a lower surface LS of the display panel 50 has a convex curved surface shape corresponding to the display area DA.

The spacer SM4 is disposed on the driving circuit film DF to maintain a gap between a driving chip IC and a lower surface LS of the display panel 50. A supporting surface SS of the spacer SM4, which makes contact with the lower surface LS, has a convex shape corresponding to the shape of the lower surface LS. Thus, a pressure applied to the driving chip IC is alleviated by the spacer SM4 to prevent the driving chip IC from being damaged, and the gap between the driving chip IC and the lower surface LS is maintained by the spacer SM4 to prevent the driving chip IC from being bent due to the shape of the lower surface LS.

Figure 7A:
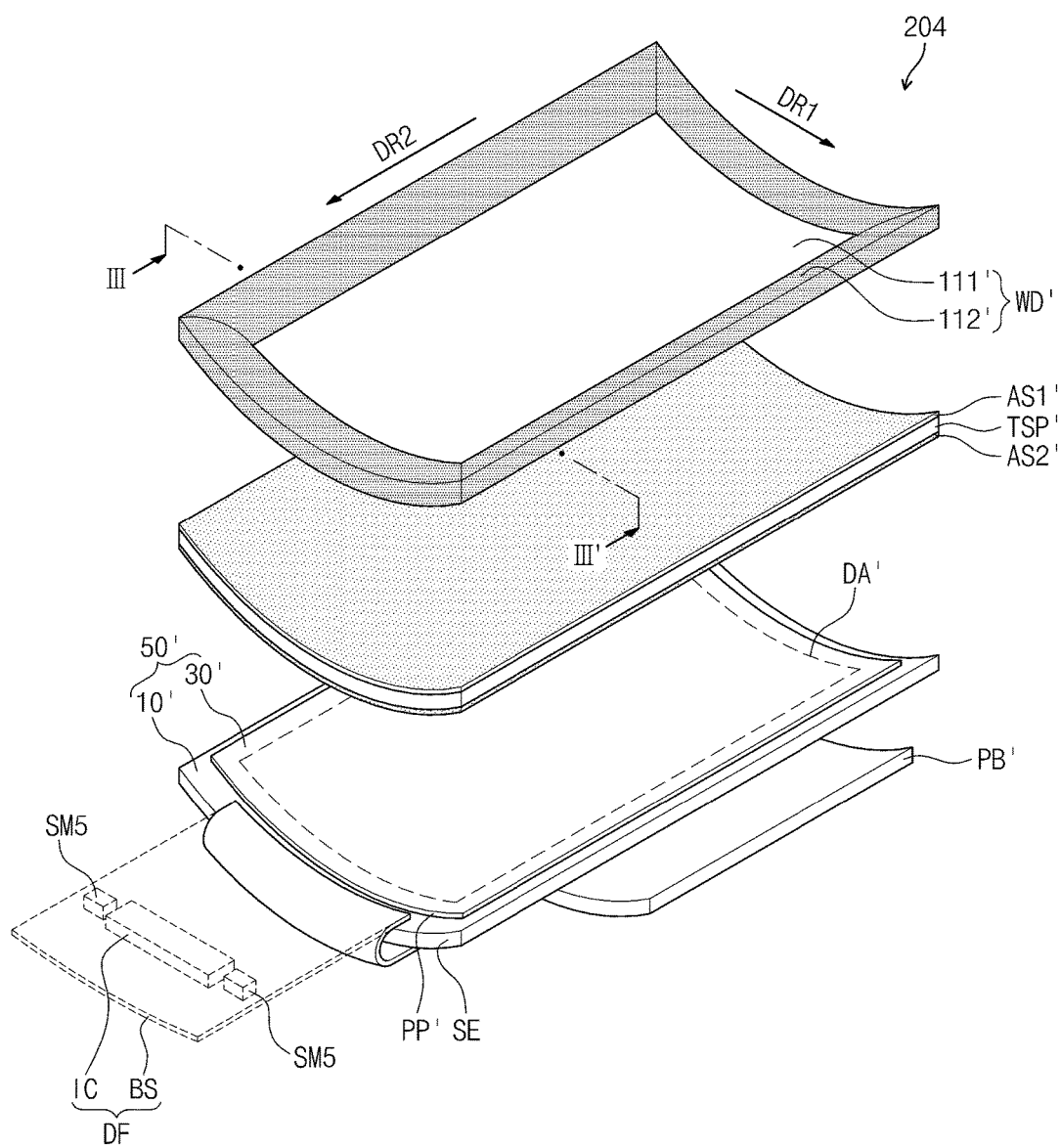
FIG. 7A is an exploded perspective view showing a flexible display device according to another example embodiment of the present disclosure.
Figure 7B:
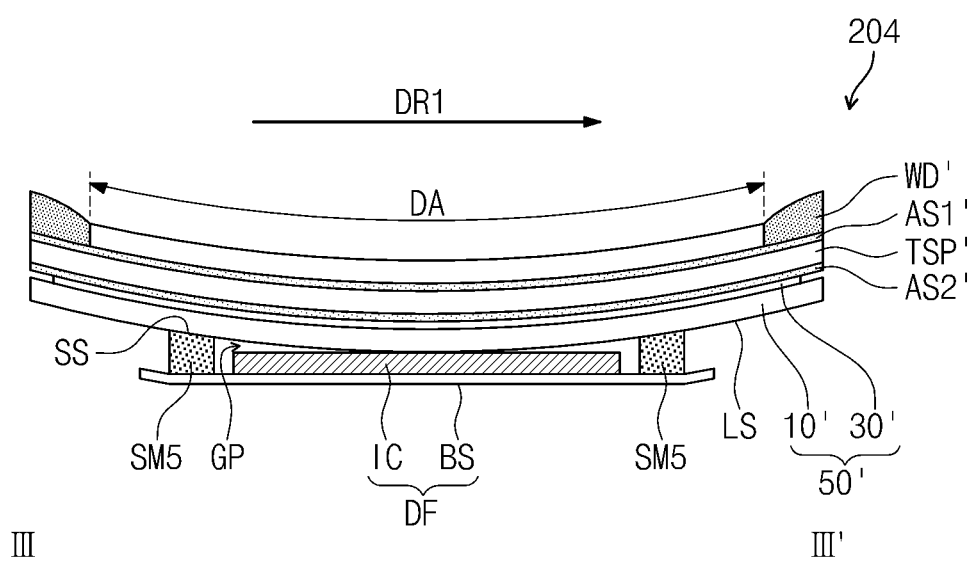
FIG. 7B is a cross-sectional view taken along a line III-III' of FIG. 7A.

FIG. 7A is an exploded perspective view showing a flexible display device according to another example embodiment of the present disclosure, and FIG. 7B is a cross-sectional view taken along the line III-III' of FIG. 7A.

Referring to FIGS. 7A and 7B, a flexible display device 204 includes a display panel 50', a driving circuit film DF', a driving circuit board PB', a first adhesive member AS1', a touch screen TSP', a second adhesive member AS2', a window substrate WD', and a spacer SM5.

The display panel 50' has a flexible property and is curved along a first direction DR1. Thus, a display area DA' displaying an image in the display panel 50' has a curved surface shape along the first direction DR1. According to the example embodiments described with reference to FIGS. 1, 2A, and 2B, the long side LE (refer to FIG. 1) of the display panel 50 (refer to FIG. 1) is curved along the first direction DR1, however a short side SE of the display panel 50' (e.g., a shorter side of the display panel 50') is curved along the first direction DR1 in the present example embodiment shown in FIGS. 7A and 7B.

Each of the driving circuit film DF', the driving circuit board PB', the first adhesive member AS1', the touch screen TSP', the second adhesive member AS2', and the window substrate WD' may be curved along the first direction DR1 along with the display panel 50'.

Similar to the spacer SM described with reference to FIG. 2B, the spacer SM5 is disposed on the driving circuit film DF' to maintain a gap GP between a driving chip IC and a lower surface LS of the display panel 50'. As described earlier, when the display panel 50' is curved along the first direction DR1, not only is the display area DA' curved along the first direction DR1, but the lower surface LS is also curved along the first direction DR1 to have a curved surface shape. Thus, a supporting surface SS of the spacer SM5 making contact with the lower surface LS has a curved surface shape corresponding to the curved surface shape of the lower surface LS. In addition, because a height of the lower surface LS may vary with respect to the base film BS, the spacer SM5 has a variable thickness depending on the height of the lower surface LS (that is, the spacer SM5 has a variable thickness depending on a distance between the lower surface LS and the base film BS).

Because the spacer SM5 makes contact with the lower surface LS, a pressure applied to the driving chip IC is alleviated by the spacer SM5, and thus the driving chip IC is prevented from being damaged by the pressure applied to the driving chip IC. In addition, because the gap GP between the driving chip IC and the lower surface LS is maintained by the spacer SM5, the driving chip IC is prevented or protected from being bent and cracked along with the curved surface shape of the lower surface LS.

Although the example embodiments of the present disclosure have been described herein, it is understood that the present disclosure should not be limited to these example embodiments but various changes and modifications can be made by one ordinary skilled in the art within the spirit and scope of the present disclosure as hereinafter claimed and their equivalents.

What is claimed is:
1. A curved display device comprising:
a display panel curved along a first direction, the display panel comprising a terminal part configured to receive a driving signal;
a driving circuit film comprising a base film and a driving chip centered on the base film, the driving chip being configured to generate the driving signal, the driving circuit film being configured to apply the driving signal to the display panel, and the driving circuit film being coupled to the terminal part and bent toward a lower surface of the display panel; and
a spacer disposed between the base film and the display panel,
wherein a first surface of the spacer contacting a lower surface of the display panel is curved by the display panel along the first direction, a second surface of the spacer is nonparallel with the first surface in the first direction, and the second surface is opposite the first surface, and
wherein a height of the first surface of the spacer from the base film is greater than a height of a surface of the driving chip facing the lower surface of the display panel from the base film.

2. The curved display device of claim 1, wherein a display area of the display panel and the lower surface of the display panel have a curved shape.

3. The curved display device of claim 2, wherein the spacer has a supporting surface contacting the lower surface of the display panel, and the supporting surface has a curved shape corresponding to the curved shape of the lower surface.

4. The curved display device of claim 2, wherein the spacer is between the lower surface of the display panel and the driving chip.

5. The curved display device of claim 4, wherein the spacer extends past both sides of the driving chip.

6. The curved display device of claim 2, wherein the spacer is between the lower surface of the display panel and the base film.

7. The curved display device of claim 6, wherein the spacer comprises two spacers, the spacers being spaced from and at opposite ends of the driving chip, respectively.

8. The curved display device of claim 6, wherein the spacer has a closed-loop shape to surround a perimeter of the driving chip.

9. The curved display device of claim 6, wherein the spacer surrounds a portion of a perimeter of the driving chip.

10. The curved display device of claim 1, wherein the terminal part extends along the first direction.

11. The curved display device of claim 10, wherein a shorter side of the display panel is curved along the first direction.

12. The curved display device of claim 10, wherein a longer side of the display panel is curved along the first direction.

13. The curved display device of claim 10, wherein the driving chip extends along the first direction.

14. The curved display device of claim 1, further comprising a driving circuit board adjacent to the lower surface of the display panel and electrically coupled to the driving circuit film,
wherein the driving circuit film is bent from the terminal part toward the driving circuit board.

15. The curved display device of claim 1, further comprising:
a window substrate comprising a light transmissive portion and covering the display panel; and
a touch screen between the window substrate and the display panel and configured to detect a touch position generated on the window substrate,
wherein the window substrate and the touch screen are curved together with the display panel.

16. The curved display device of claim 1, wherein the display panel comprises a display area having a curved shape, and the display area has a concave shape.

17. The curved display device of claim 1, wherein the display panel comprises a display area having a curved shape, and the display area has a convex shape.

18. The curved display device of claim 6, wherein the spacer has a closed-loop shape and overlaps a portion of the driving chip.

19. The curved display device of claim 6, wherein the spacer extends along at least a portion of a side of the driving chip and extends past the side and an opposite side of the driving chip.

20. The curved display device of claim 1, wherein the spacer comprises:
   a plurality of first portions extending in the first direction; and
   a plurality of second portions extending in a second direction crossing the first direction, and
   wherein a width of each of the first portions is different from a width of each of the second portions.

21. The curved display device of claim 1, wherein the driving chip is on a first surface of the base film, and
   wherein an angle between the display panel and the first surface of the base film is different than 0°.

22. The curved display device of claim 1, wherein the lower surface of the display panel has a convex shape, the first surface of the spacer has a concave shape, and the first surface of the spacer has the same curvature as the lower surface of the display panel.

* * * * *